(12) United States Patent
Furuta

(10) Patent No.: US 8,296,939 B2
(45) Date of Patent: Oct. 30, 2012

(54) MOUNTING METHOD USING DILATANCY FLUID

(75) Inventor: Kazutaka Furuta, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 302 days.

(21) Appl. No.: 12/635,651

(22) Filed: Dec. 10, 2009

(65) Prior Publication Data
US 2010/0085723 A1 Apr. 8, 2010

Related U.S. Application Data

(63) Continuation of application No. PCT/JP2009/001901, filed on Apr. 24, 2009.

(30) Foreign Application Priority Data

Aug. 8, 2008 (JP) .................................. 2008-206217
Sep. 22, 2008 (JP) .................................. 2008-242946

(51) Int. Cl.
*H05K 3/30* (2006.01)
(52) U.S. Cl. ........ 29/832; 29/739; 156/242; 228/180.21
(58) Field of Classification Search ................. 156/228, 156/242, 297, 358; 219/85.12; 228/180.21, 228/235.1; 29/830–832, 840, 841, 846, 848, 29/739
See application file for complete search history.

(56) References Cited

U.S. PATENT DOCUMENTS 3,529,117 A * 9/1970 Costello ............ 219/85.12
7,556,190 B2 * 7/2009 Matsumura et al. ..... 228/180.21
2006/0113356 A1 6/2006 Matsumura et al.
2009/0032570 A1 2/2009 Matsumura
2009/0038753 A1 2/2009 Matsumura
2009/0230171 A1 9/2009 Matsumura et al.
2009/0314437 A1 12/2009 Matsumura

FOREIGN PATENT DOCUMENTS

CN 1823409 A 8/2006
JP 6-90099 A 3/1994

(Continued)

OTHER PUBLICATIONS

Japanese Office Action dated Nov. 22, 2011, in a counterpart Japanese Patent application No. 2008-242946, citing Foreign Patent document JP 2004-322490, JP H8-146451, JP 2006-202806, JP H6-90099, JP H10-150297, WO 2007/80956, and JP 2002-17519.

(Continued)

Primary Examiner — Donghai D. Nguyen
(74) Attorney, Agent, or Firm — Chen Yoshimura LLP

(57) ABSTRACT

Even pressure is applied to a mounting target, even in a case where electronic components having different heights from each other are attempted to be mounted to a substrate, or in a case where an electronic component is attempted to be mounted to a substrate whose rear surface is provided with another electronic component. A mounting device 100 includes a lower pressurizing section 102 as a first pressurizing section and an upper pressurizing section 104 as a second pressurizing section, and pressurizes a substrate, a plurality of electronic components, and the like, sandwiched between the lower pressurizing section 102 and the upper pressurizing section 104, thereby mounting the substrate to the plurality of electronic components. The lower pressurizing section 102 or the upper pressurizing section 104 includes a dilatancy fluid 116.

6 Claims, 10 Drawing Sheets

FOREIGN PATENT DOCUMENTS

| | | |
|---|---|---|
| JP | H08-146451 A | 6/1996 |
| JP | 10-150297 A | 6/1998 |
| JP | 2002-17519 A | 1/2002 |
| JP | 2004-322490 A | 11/2004 |
| JP | 2006-202806 A | 8/2006 |
| JP | 3921459 B2 | 5/2007 |
| JP | 2007-227622 A | 9/2007 |
| WO | 2007/080956 A1 | 7/2007 |

OTHER PUBLICATIONS

Chinese Office Action dated Aug. 26, 2011, in a counterpart Chinese application No. 200980000403.3.

International Search Report (ISR) issued in PCT/JP2009/001901 (parent application) for Examiner consideration, citing U.S. Patent Application Publication No. 2.

Japanese Office Action in a counterpart application No. 2008-242946, dated Aug. 9, 2011, citing Foreign Patent document No. 1, JP H6-90099, JP H10-150297, WO 2007/80956, and JP 2002-17519.

Japanese Office Action dated Oct. 18, 2011, in a counterpart Japanese Patent application No. 2008-242946, and JP 2004-322490, JP H6-90099, JP H10-150297, WO 2007/80956, and JP 2002-17519.

Written Opinion (PCT/ISA/237) issued in PCT/JP2009/001901 (parent application) mailed in Jul. 2009.

* cited by examiner

500

`US 8,296,939 B2`

MOUNTING METHOD USING DILATANCY FLUID

CROSS REFERENCE TO RELATED APPLICATION

This is a continuation application of PCT/JP2009/001901 filed on Apr. 24, 2009 which claims priority from Japanese Patent Applications No. 2008-206217 filed on Aug. 8, 2008 and No. 2008-242946 filed on Sep. 22, 2008, the contents of which are incorporated herein by reference.

BACKGROUND

1. Technical Field

The present invention relates to a mounting device, a mounting method, a package, and a pressurizing plate. In particular, the present invention relates to a mounting device, a mounting method, a package, and a pressurizing plate, for allowing even pressure to be applied to a mounting target, even in a case where electronic components having different heights from each other are attempted to be mounted to a substrate, or in a case where an electronic component is attempted to be mounted to a substrate whose rear surface is provided with another electronic component.

2. Related Art

Japanese Patent Application Publication No. 2007-227622 and Japanese Patent No. 3921459, for example, disclose a mounting device whose head or mount is made of elastomer such as silicone rubber. A mounting device equipped with elastomer can mount, onto a substrate, a plurality of electronic components having different heights from each other at a time, and therefore is applicable even when a conventional metal head cannot be used due to the unevenness among the electronic components. Moreover, the mounting device equipped with elastomer is useful in assuring connection between an electronic component and a substrate.

In these days, in the upsurge of fine pitch connection, there is demand for a mounting method adapted for fine pitch connection. In the recent trend of high density IC package, it has become common to attempt to mount a component to a substrate whose rear surface is already provided with another component. Reliable connection is also desired in these cases.

SUMMARY

So as to solve the above problems, according to the first aspect related to the innovations herein, one exemplary mounting device includes a first pressurizing section and a second pressurizing section for mounting a first mounting target and a second mounting target sandwiched between the first pressurizing section and the second pressurizing section, where the first pressurizing section or the second pressurizing section includes a dilatancy fluid. It is also possible to provide a mounting device including a first pressurizing section and a second pressurizing section which are used in performing mounting, where the first pressurizing section or the second pressurizing section includes a dilatancy fluid may be provided.

In the mounting device stated above, the first pressurizing section or the second pressurizing section may include a heating section. In this case, the heating section may heat the first mounting target or the second mounting target. In the mounting device stated above, it is possible to arrange so that pressurizing surfaces respectively of the first pressurizing section and the second pressurizing section are substantially flat, and that the first pressurizing section includes the dilatancy fluid, and that the second pressurizing section is provided above the first pressurizing section. The mounting device stated above may further include a cover sheet that covers an upper surface of the dilatancy fluid; a carrier that carries the cover sheet; and a leveling section provided to an end of the first pressurizing section, the leveling section restraining the dilatancy fluid from being carried away with the cover sheet, where the first pressurizing section and the second pressurizing section perform the mounting via the cover sheet. The first pressurizing section and the second pressurizing section may pressurize a first mounting target and a second mounting target sandwiched between the first pressurizing section and the second pressurizing section.

According to the second aspect related to the innovations herein, one exemplary mounting method includes preparing a first mounting target and a second mounting target, adjusting a relative relation between the first mounting target and the second mounting target, and sandwiching and pressurizing the first mounting target and the second mounting target between a first pressurizing section and a second pressurizing section, where the first pressurizing section or the second pressurizing section includes a dilatancy fluid. It is also possible to provide a mounting method including adjusting a relative positional relation between a first mounting target and a second mounting target; and sandwiching and pressurizing the first mounting target and the second mounting target between a first pressurizing section and a second pressurizing section, where the first pressurizing section or the second pressurizing section includes a dilatancy fluid. In the stated mounting method, prior to adjusting the relative positional relation, further included is arranging the first mounting target, an anisotropic conductive film, and the second mounting target, in the stated order.

According to the third aspect related to the innovations herein, one exemplary package includes a first electronic component and a second electronic component, the package obtained by a) adjusting a relative positional relation between the first electronic component and the second electronic component, and b) sandwiching and pressurizing the first electronic component and the second electronic component between a first pressurizing section and a second pressurizing section, where at least one of the first pressurizing section and the second pressurizing section includes a dilatancy fluid.

According to the fourth aspect related to the innovations herein, one exemplary package includes a first electronic component, an anisotropic conductive film, and a second electronic component, the package obtained by a) adjusting a relative positional relation between the first electronic component and the second electronic component, b) arranging the first electronic component, the anisotropic conductive film, and the second electronic component in the stated order, and c) sandwiching and pressurizing the first electronic component and the second electronic component between a first pressurizing section and a second pressurizing section, where at least one of the first pressurizing section and the second pressurizing section includes a dilatancy fluid.

According to the fifth aspect related to the innovations herein, one exemplary package includes a substrate and a plurality of electronic components mounted to the substrate, where the plurality of electronic components are a first electronic component, a second electronic component, and a third electronic component arranged in the stated order in a direction substantially parallel to a main surface of the substrate, in a direction substantially vertical to the main surface of the substrate, a maximum distance between the first and the third electronic components and the second electronic component is 1 mm or above, and in a direction substantially parallel to the main surface of the substrate, a minimum distance between the first electronic component and the third electronic component is 0.8 mm or below.

According to the sixth aspect related to the innovations herein, one exemplary pressurizing plate is for use in a pressurizing apparatus for mounting and electrically coupling a plurality of electric components and includes: a dilatancy fluid; and a base that retains the dilatancy fluid.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
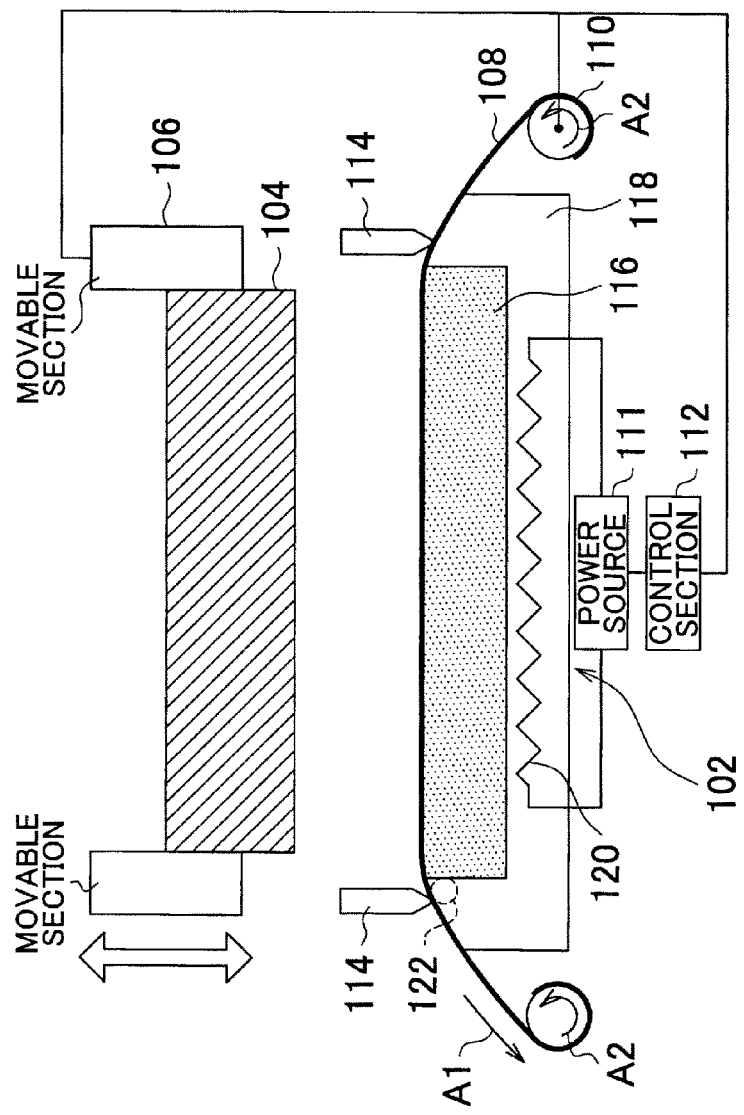
FIG. 1 shows an overview of a mounting device 100 according to the present embodiment.

FIG. 1 shows an example of a mounting device 100 according to the present embodiment. The mounting device 100 mounts a plurality of electric components to a substrate thereby electrically couples the electric components to the substrate. Note that "electric component" used in the present specification includes "interconnect substrate." Some examples of the interconnect substrate are an insulation plate such as glass epoxy or a bake plate or a flexible insulation sheet made of polyimide to which interconnect of conductive coating such as copper foil is provided. In FIG. 1, the bottom corresponds to the direction of gravitational force.

The mounting device 100 includes a lower pressurizing section 102, an upper pressurizing section 104, a movable section 106, a cover sheet 108, a carrier 110, a power source 111, a control section 112, and a holding section 114. The lower pressurizing section 102 includes a dilatancy fluid 116, a base 118, and a heating section 120.

The lower pressurizing section 102 may be an example of a first pressure section, and functions as a pressurizing plate of the mounting device 100. The dilatancy fluid 116 provided at the lower pressurizing section 102 may be a substance that changes from a liquid state to a solid state when applied shearing stress (shearing force). Such a substance can take a fluid form when the shearing stress is small, while taking a solid form when the shearing stress becomes large. Therefore, the substance can change its form according to the change in form of a mounting target, and function as a mount of the mounting target. Preferably, the dilatancy fluid 116 consists of powders whose particle diameters are uniform, with sphericity of 1.5 μm or below, and average particle diameter of 0.05 μm-30 μm. The sphericity can be measured in a measurement method of steel spheres for ball bearing prescribed in JIS B1501.

When pressurized slowly, the dilatancy fluid 116 changes the form of the surface thereof contacting the mounting target, to conform to the form of the mounting target. On the other hand, the dilatancy fluid 116 can consolidate to a certain level if appropriate welding force is selected, to cause a drag against the welding force. As a result, the dilatancy fluid 116 can apply an even pressure to the mounting target, without causing the entire mounting target to sink into the dilatancy fluid 116.

The base 118 retains the dilatancy fluid 116. The base 118 is designed to function as a mount of the fluid 116, and may be made of a material that does not deteriorate the dilatancy fluid 116 as well as being not deteriorated by the dilatancy fluid 116. One example of such material is metal. The base 118 may include a leveling section 122 at the end thereof. The leveling section 122, pressed against cover sheet 108 by the holding section 114, restrains the dilatancy fluid 116 from being carried away with the cover sheet 108 at the time of exchange of the cover sheet 108.

The heating section 120 applies heat to the mounting target. The heating section 120 may be a heater by means of resistive heating, or a halogen lamp by means of lamp heating. The heating section 120 is supplied with a power from the power source 111 controlled by the control section 112. In the present embodiment, the heating section 120 is placed inside the base 118, to heat the mounting target via the dilatancy fluid 116. Or, the heating section 120 may be placed within the dilatancy fluid 116, to heat the mounting target via the dilatancy fluid 116. In this case, the dilatancy fluid 116 has to be heat resistant. By placing the heating section 120 at the lower pressurizing section 102, the mechanism of the upper pressurizing section 104 can be simplified, which is very advantageous if it is the upper pressurizing section 104 that moves up and down.

The upper pressurizing section 104 may be an example of a second pressurizing section, and moves up and down by means of the movable section 106. The upper pressurizing section 104 may be an inelastic member such as metal, or an elastic member such as elastomer. The upper pressurizing section 104 is provided above the lower pressurizing section 102, and the pressurizing surfaces respectively of the upper pressurizing section 104 and of the lower pressurizing section 102 are substantially flat. The lower pressurizing section 102 and the upper pressurizing section 104 pressurize a mounting target sandwiched therebetween, thereby mounting the target.

When the rear surface of a substrate (a mounting target) already has any electronic component mounted thereon, the upper pressurizing section 104 may have concave and convex in accordance with the form of the electronic component(s) provided at the rear surface of the substrate. It should be noted that the heating section 120 is provided at the lower pressurizing section 102 in the present embodiment, the heating section 120 may be provided at the upper pressurizing section 104. When the upper pressurizing section 104 is not provided with a heating section, the pressurizing surface of the upper pressuring section 104 can be made of an elastomer material having poor heat resistance. If the pressurizing surface is made of an elastomer material, a mounting target having concave and convex can be evenly pressurized. The lower pressurizing section 102 and the upper pressurizing section 104 may include a cooling section.

The movable section 106 moves the upper pressurizing section 104 up and down. By the up and down movement, the lower pressurizing section 102 and the upper pressurizing section 104 sandwich and pressurize the mounting target.

The cover sheet 108 covers the upper surface of the dilatancy fluid 116. By insertion of the cover sheet 108 between the dilatancy fluid 116 and the electronic component, the dilatancy powders are prevented from being attached to the electronic component (i.e. mounting target). The lower pressurizing section 102 sandwiches the mounting target with the upper pressurizing section 104, via the cover sheet 108 which elongates in the form of the mounting target. The cover sheet 108 is selected to have a material and a thickness to elongate depending on the form of the mounting target without broken. An example of the material of the cover sheet 108 is a PTFE (polytetrafluoroethylene) sheet having a thickness of 0.05 mm. The cover sheet 108 may take a sheet form having its longitudinal side in the A1 direction in the drawing, if it is exchanged for each mounting operation.

The carrier 110 carries the cover sheet 108 by winding it in A2 direction for example. The carrier 110 may exchange the cover sheet 108 covering the upper surface of the dilatancy fluid 116 every time a mounting operation has finished. At the exchange of the cover sheet 108, the leveling section 122 restrains the dilatancy fluid 116 from being carried away with the cover sheet 108.

The control section 112 controls the operation of the movable section 106, the carrier 110, and the power source 111. Although shown to be connected to only one of the movable section 106 and the carrier 110 in FIG. 1, the control section 112 also controls the operation of the other of the movable section 106 and the carrier 110 that is not connected to the control section 112.

Figure 2:
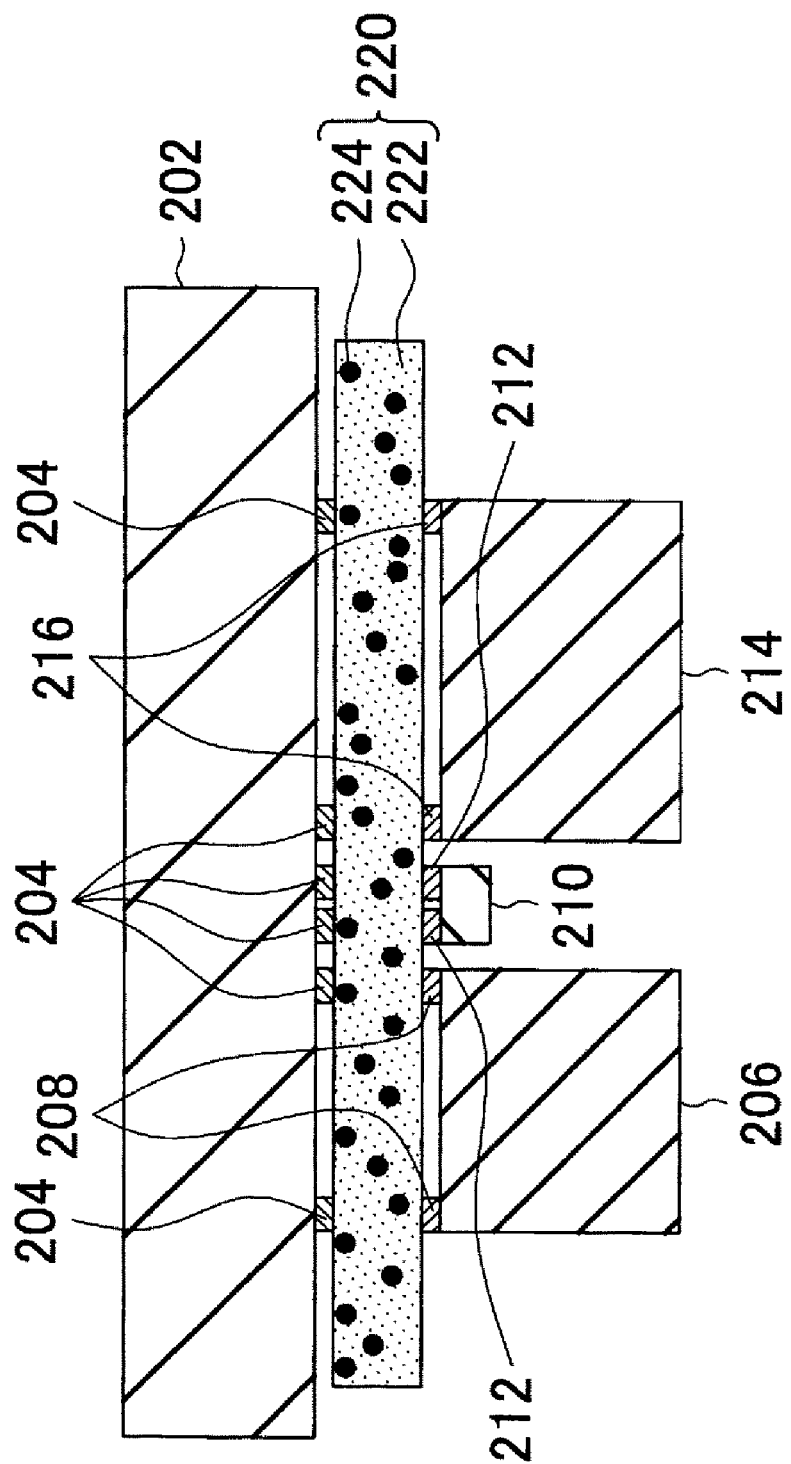
FIG. 2 shows an exemplary cross section of a package 300 in a mounting operation.

FIG. 2 shows an exemplary cross section of a package in a mounting operation. The substrate 202 may be one example of a first mounting target. First, second, and third electric components 206, 210, and 214 are provided on the substrate 202 in this order in a direction parallel to the main surface of the substrate 202. The substrate 202 may be made of plastic, polymer film, silicon substrate, glass, or a laminate of them. The substrate 202 may include a conductive section 204 to allow electric connection of the substrate 202 to the other electric components or the like.

The first electric component 206 may be an example of a second mounting target. The first electric component 206 operates by being bonded to the substrate 202 or the like. The first electric component 206 may include a conductive section 208 to allow electric connection of the first electric component 206 to the substrate 202 or the like.

The second electric component 210 may be an example of the second mounting target. The second electric component 210 operates by being bonded to the substrate 202 or the like. The second electric component 210 may include a conductive section 212 to allow electric connection of the second electric component 210 to the substrate 202 or the like.

The third electric component 214 may be an example of the second mounting target. The third electric component 214 operates by being bonded to the substrate 202 or the like. The third electric component 214 may include a conductive section 216 to allow electric connection of the third electric component 214 to the substrate 202 or the like.

The first, second, and third electric components 206, 210, and 214 may respectively be a land grid array (LBA) where flat electrode pads are arranged in a grid formation, instead of a ball grid array (BGA) where ball-shaped electrodes by means of soldering are provided in a grid formation using a dispenser or instead of the ball-shaped electrodes of BGA. In the direction substantially vertical to the main surface of the substrate 202, the maximum distance of the second electronic component 210 from the first and third electronic components 206 and 214 may be 1 mm-1.5 mm for example.

In the direction parallel to the main surface of the substrate 202, the minimum distance between the first electronic component 206 and the second electronic component 210 as well as the minimum distance between the second electronic component 210 and the third electronic component 214 may be approximately 0.05 mm. When the width of the second electronic component 210 is 0.2 mm in the direction substantially parallel to the main surface of the substrate 202, the distance between the first electronic component 206 and the third electronic component 214 can be set to approximately 0.3 mm (e.g. between 0.3 mm and 0.8 mm). However, in realization of electronic components having minimum width smaller than 0.2 mm, the minimum distance between the first electronic component 206 and the third electronic component 214 can be smaller than 0.3 mm in the direction substantially parallel to the main surface of the substrate 202.

An anisotropic conductive film 220, by being pressurized and heated, is able to electrically and physically bond the substrate 202, the first, second, and third electronic components 206, 210, and 214 each other. The anisotropic conductive film 220 may have a thickness sufficient for filling, with the adhesive resin 222, the spaces created between the mounting targets when mounting the mounting targets. The anisotropic conductive film 220 may contain the adhesive resin 222 functioning as an adhesive agent, and conductive particles 224 dispersed in the adhesive resin 222. The anisotropic conductive film 220 may be an anisotropic conductive film (ACF) and an anisotropic conductive paste (ACP), for example.

The anisotropic conductive film 220 is pressed down between the substrate 202 and the first, second, and third electronic components 206, 210, 214, so that conductive particles 224 electrically connect the substrate 202 and the first, second, and third electronic components 206, 210, 214. Upon heating of the anisotropic conductive film 220 between substrate 202 and the first, second, and third electronic components 206, 210, 214, the adhesive resin 222 is hardened to physically bond the substrate 202 and the first, second, and third electronic components 206, 210, 214, instead of the anisotropic conductive film 220, there may be a member allowing NCF connection (e.g. epoxy resin film not including any conductive particles) between substrate 202 and the first, second, and third electronic components 206, 210, 214.

FIG. 2 shows a state after a step of preparing the substrate 202 and the first, second, and third electronic components 206, 210, 214, a step of adjusting the relative positional relation among the substrate 202 and the first, second and third electronic components 206, 210, 214, and a step of arranging the substrate 202, the anisotropic conductive film 220, and the first, second, and third electronic components 206, 210, 214 in the stated order.

Figure 3:
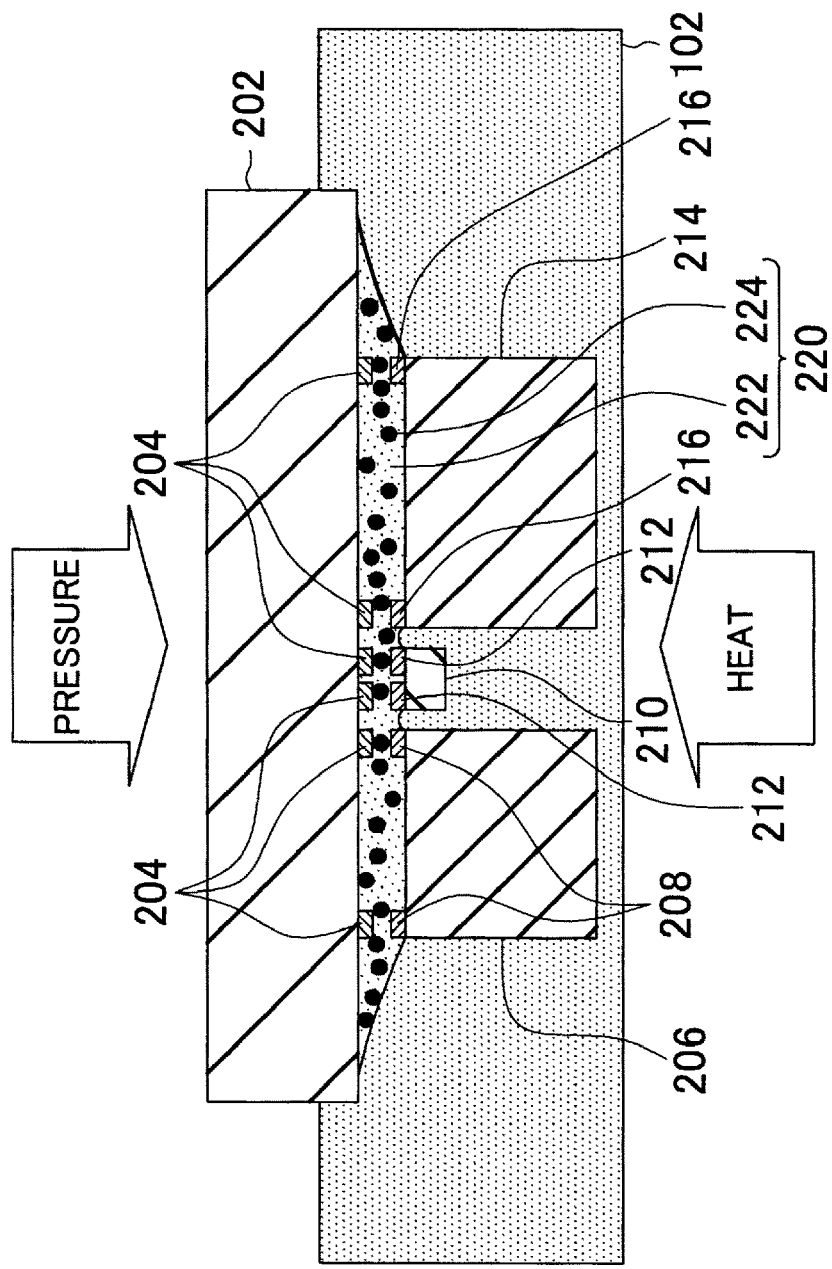
FIG. 3 shows an exemplary cross section of the package 300 in a mounting operation.

FIG. 3 shows an exemplary cross section of the package in a mounting operation. Specifically, FIG. 3 shows a step of sandwiching the substrate 202 and the first, second and third electronic components 206, 210, 214, between the lower pressurizing section 102 and the upper pressurizing section 104, to pressurize them. The package 300 completes after being subjected to pressure and heating, between the lower pressurizing section 102 containing the dilatancy fluid 116 and the upper pressurizing section 104.

Figure 4:
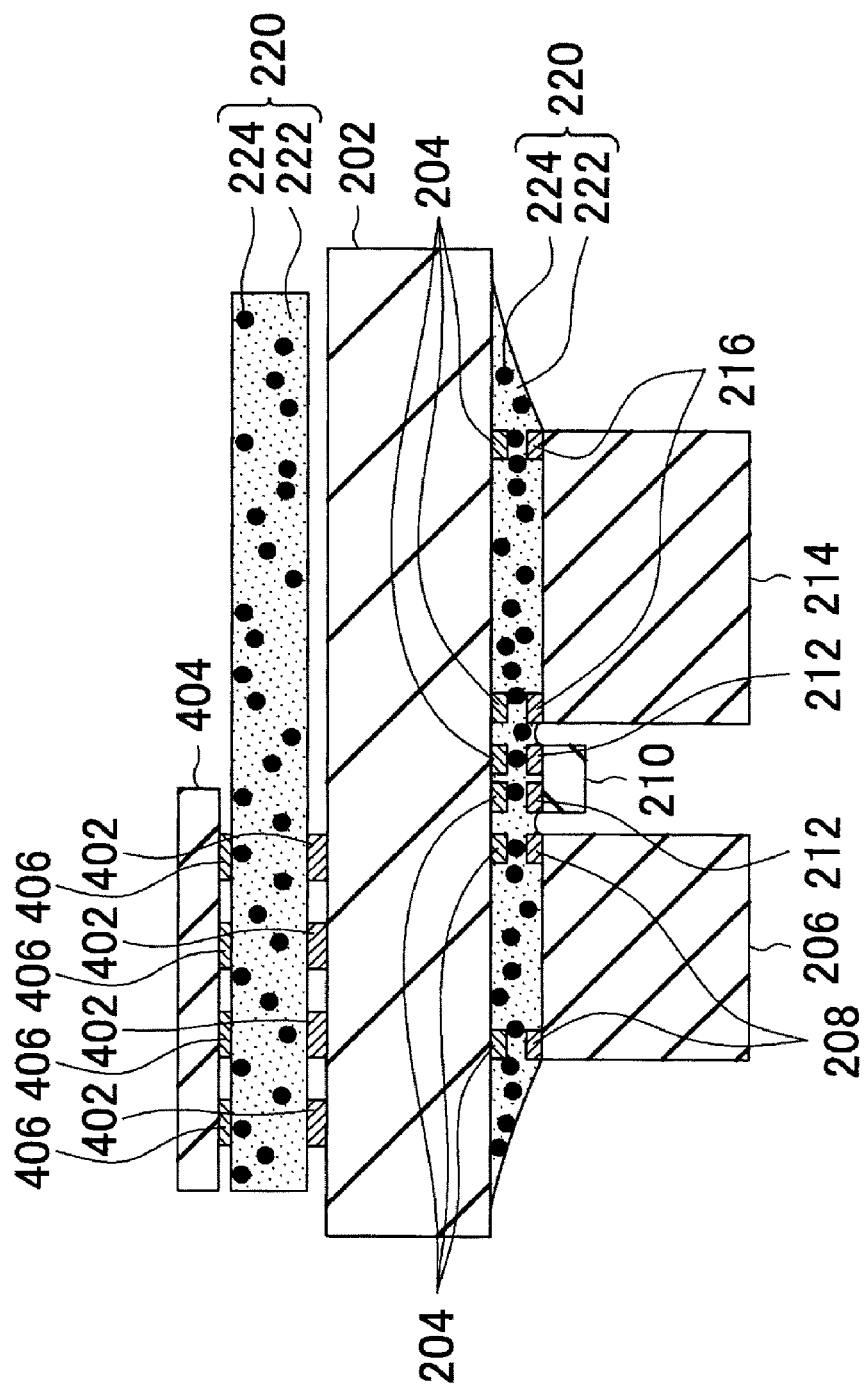
FIG. 4 shows an exemplary cross section of a package 500 in a mounting operation.

FIG. 4 shows an exemplary cross section of a package in a different mounting operation. A conductive section 402 of a substrate 202 has a conductive property, and electrically connects the substrate 202 to the other electronic components or the like. A flexible print circuit 404 may be one example of a first mounting target and a second mounting target. The flexible print circuit 404 may have a base made of an insulation film having a thickness of 12 μm-50 μm, for example. The flexible print circuit 404 may have a conductive film 406 electrically connecting the flexible print circuit 404 to the substrate 202 or the like. The conductive film 406 may be made of copper, for example.

FIG. 4 shows a state after a step of preparing the substrate 202 and the flexible print circuit 404, a step of adjusting the relative positional relation between the substrate 202 and the flexible print circuit 404, and a step of arranging the substrate 202, an anisotropic conductive film 220, and the flexible print circuit 404, in the stated order.

Figure 5:
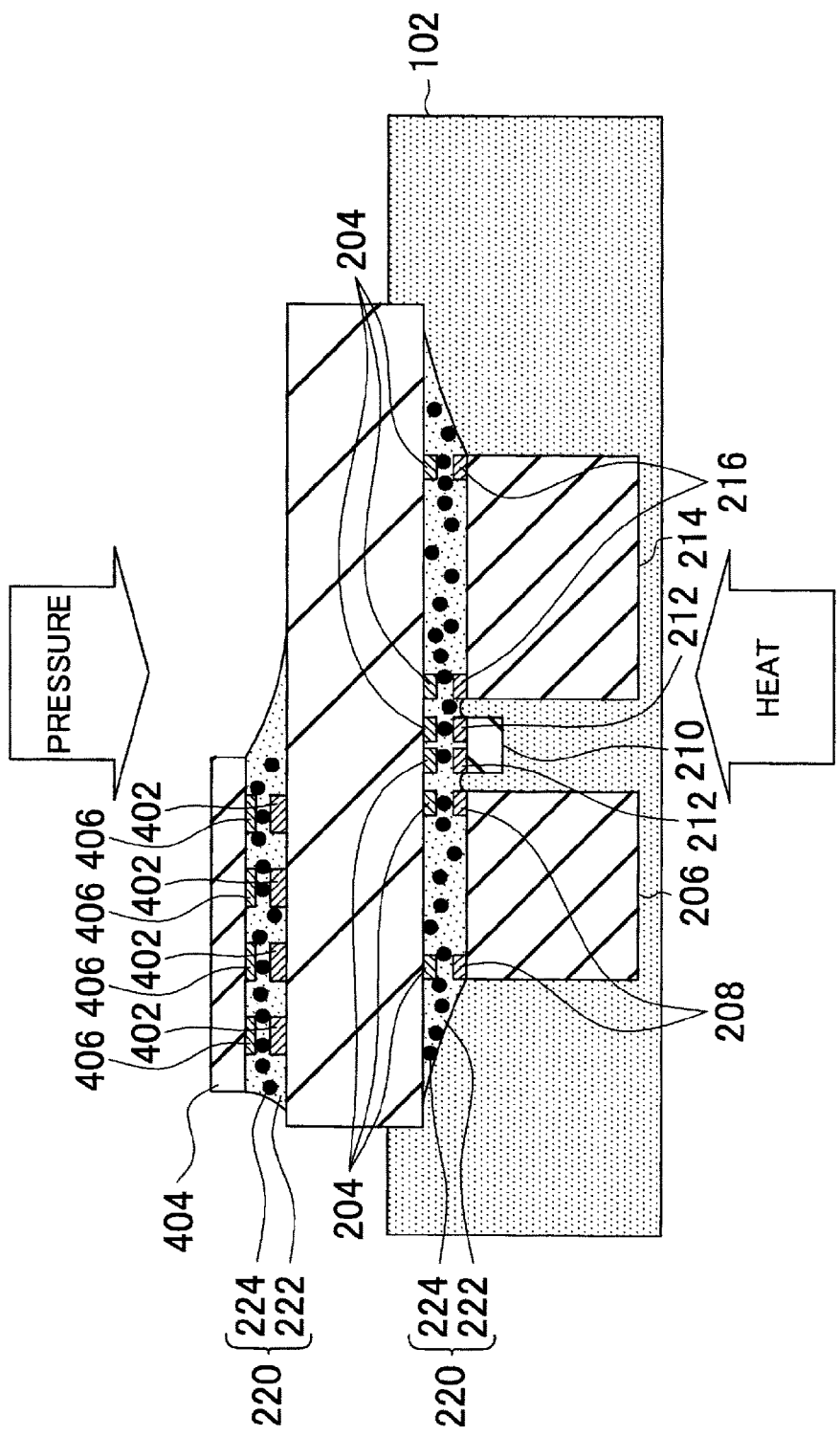
FIG. 5 shows an exemplary cross section of the package 500 in a mounting operation.

FIG. 5 shows an exemplary cross section of a package in the different mounting operation. Specifically, FIG. 5 shows a step of sandwiching the substrate 202 and the flexible print circuit 404, between the lower pressurizing section 102 and the upper pressurizing section 104, to pressurize them. The package 500 completes after being subjected to pressure and heating, between the lower pressurizing section 102 containing the dilatancy fluid 116 and the upper pressurizing section 104.

Figure 6:
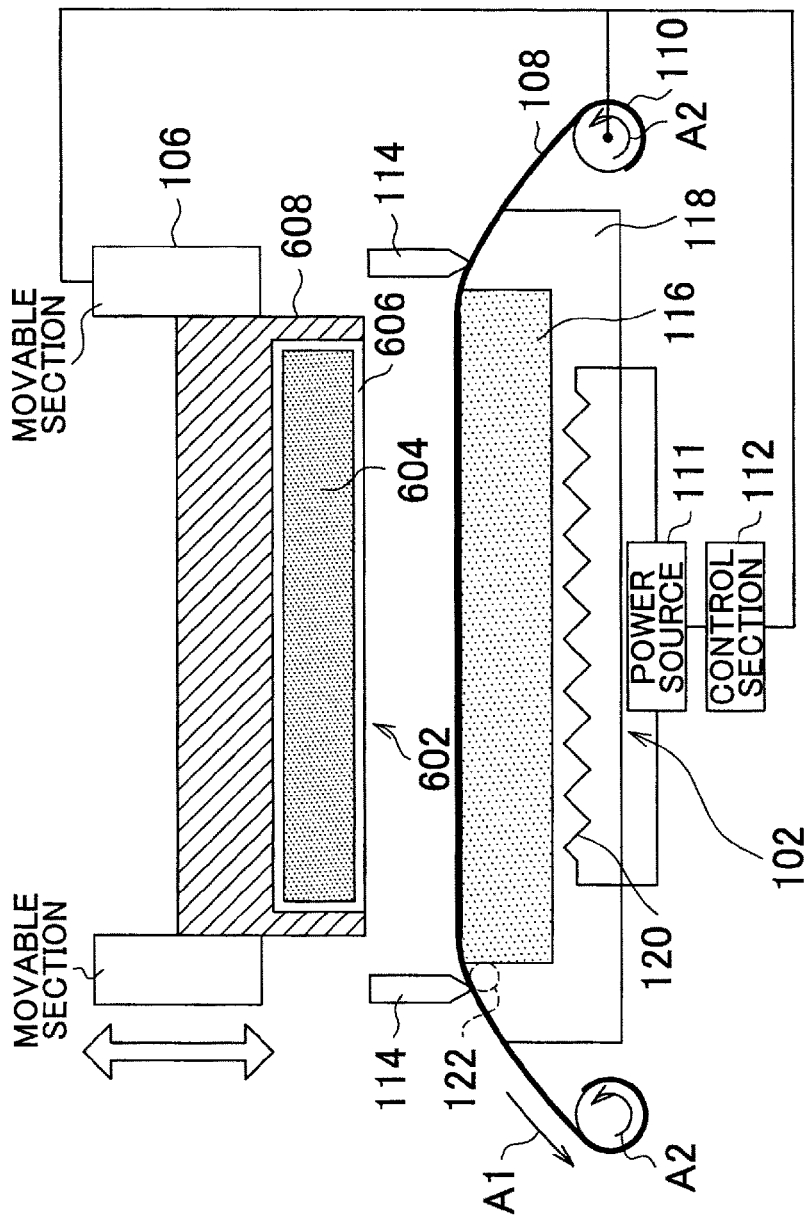
FIG. 6 shows an overview of a mounting device 600 according to a modification example of the present embodiment.

FIG. 6 shows an overview of a mounting device 600 according to a modification example of the present embodiment. An upper pressurizing section 602 of the mounting device 600 may include a dilatancy fluid 604, the cover bag 606, and a base 608.

The dilatancy fluid 604 may be produced just as the dilatancy fluid 116. The cover bag 606 may be a bag-like member produced in a material similar to the material of the cover sheet 108 of the first embodiment. The purpose of the cover bag 606 is to seal the dilatancy fluid 604 therein, to prevent the dilatancy fluid 604 from leaking outside the bag. The purpose of the base 608 is to enable the dilatancy fluid 604 to function as the upper pressurizing section 602, just as the base 118 of the first embodiment.

Figure 7:
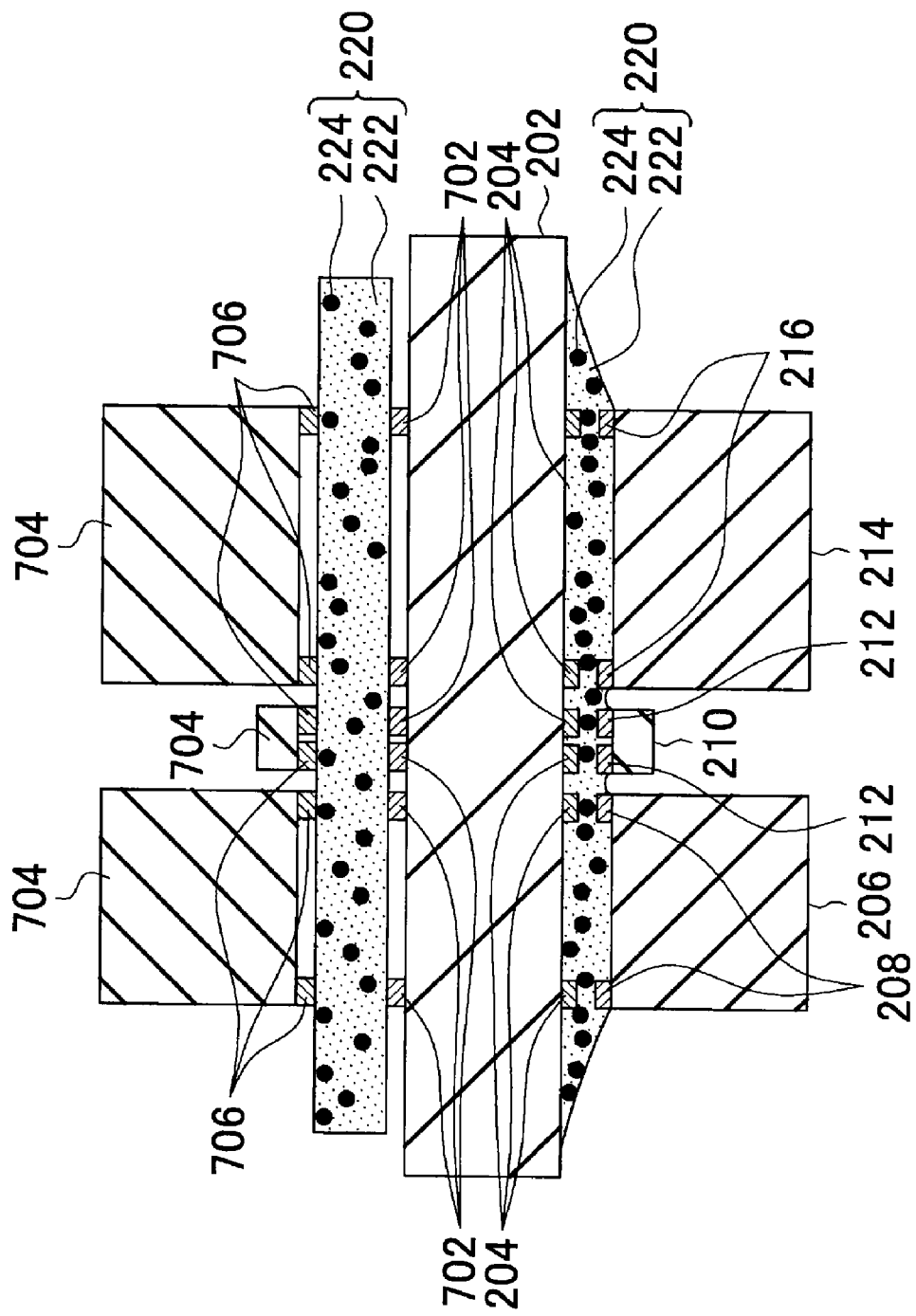
FIG. 7 shows an exemplary cross section of a package 800 in a mounting operation.

FIG. 7 shows an exemplary cross section of a package in a mounting operation performed by the mounting device 600. A conductive section 702 of the substrate 202 has a conductive property, and electrically connects the substrate 202 to the other electronic components or the like. An electronic component 704 may be an example of the first mounting target and the second mounting target. The electronic component 704 operates by being bonded to the substrate 202. The electronic component 704 may include a conductive section 706 to allow electric connection of the electronic component 704 to the substrate 202 or the like.

FIG. 7 shows a state, in a mounting operation performed using the mounting device 600, after a step of preparing the substrate 202 and a plurality of electronic components 704, a step of adjusting the relative positional relation between the substrate 202 and the plurality of electronic components 704, and a step of arranging the substrate 202, an anisotropic conductive film 220, and the plurality of electronic components 704, in the stated order.

Figure 8:
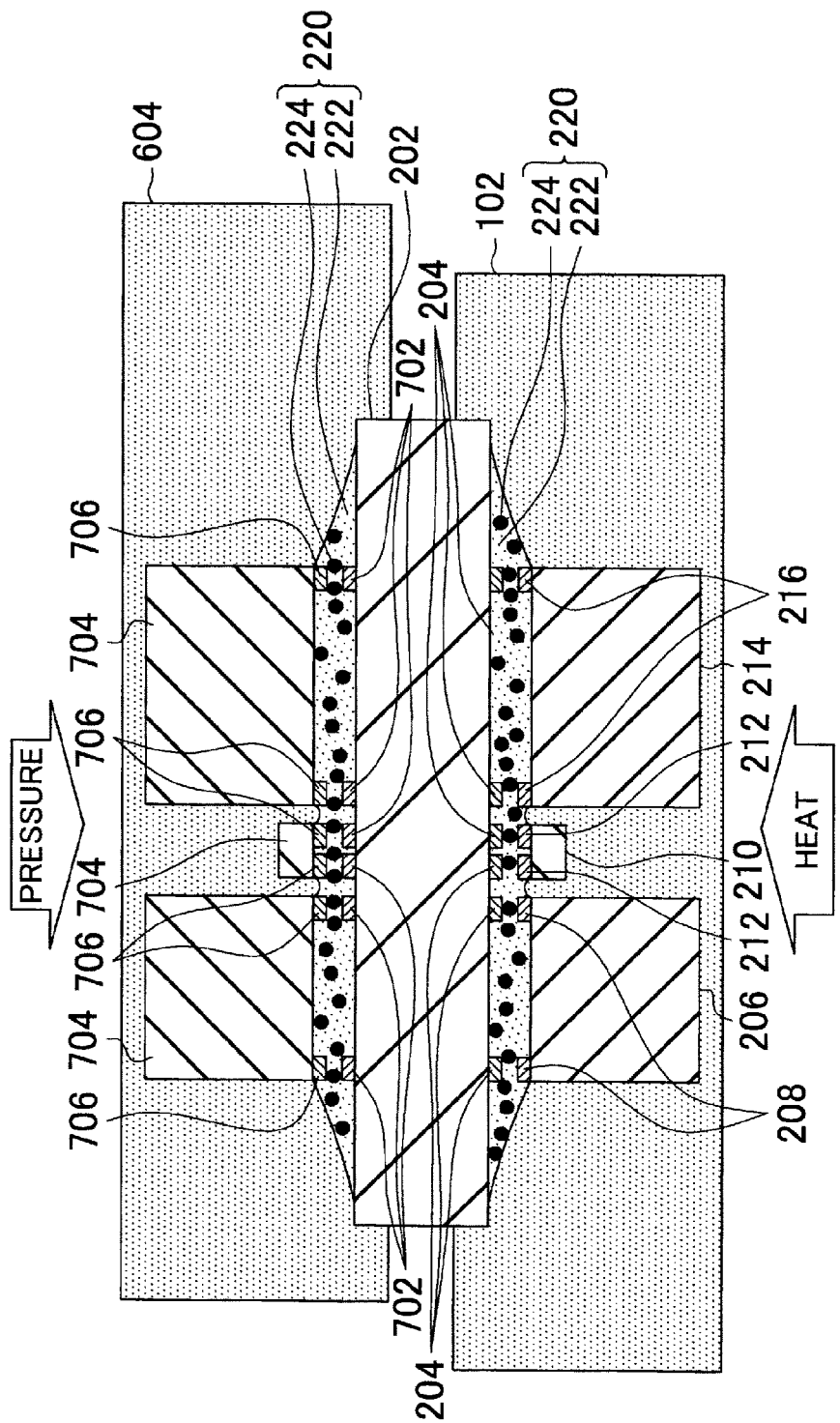
FIG. 8 shows an exemplary cross section of the package 800 in a mounting operation.

FIG. 8 shows an exemplary cross section of a package in a mounting operation performed by the mounting device 600. Specifically, FIG. 8 shows a step of sandwiching the substrate 202 and the plurality of electronic components 704, between the lower pressurizing section 102 and the upper pressurizing section 602, to pressurize them. The package 800 completes after being subjected to pressure and heating, between the lower pressurizing section 102 containing the dilatancy fluid 116 and the upper pressurizing section 602 containing the dilatancy fluid 604.

Embodiment Example 1

Figure 9:
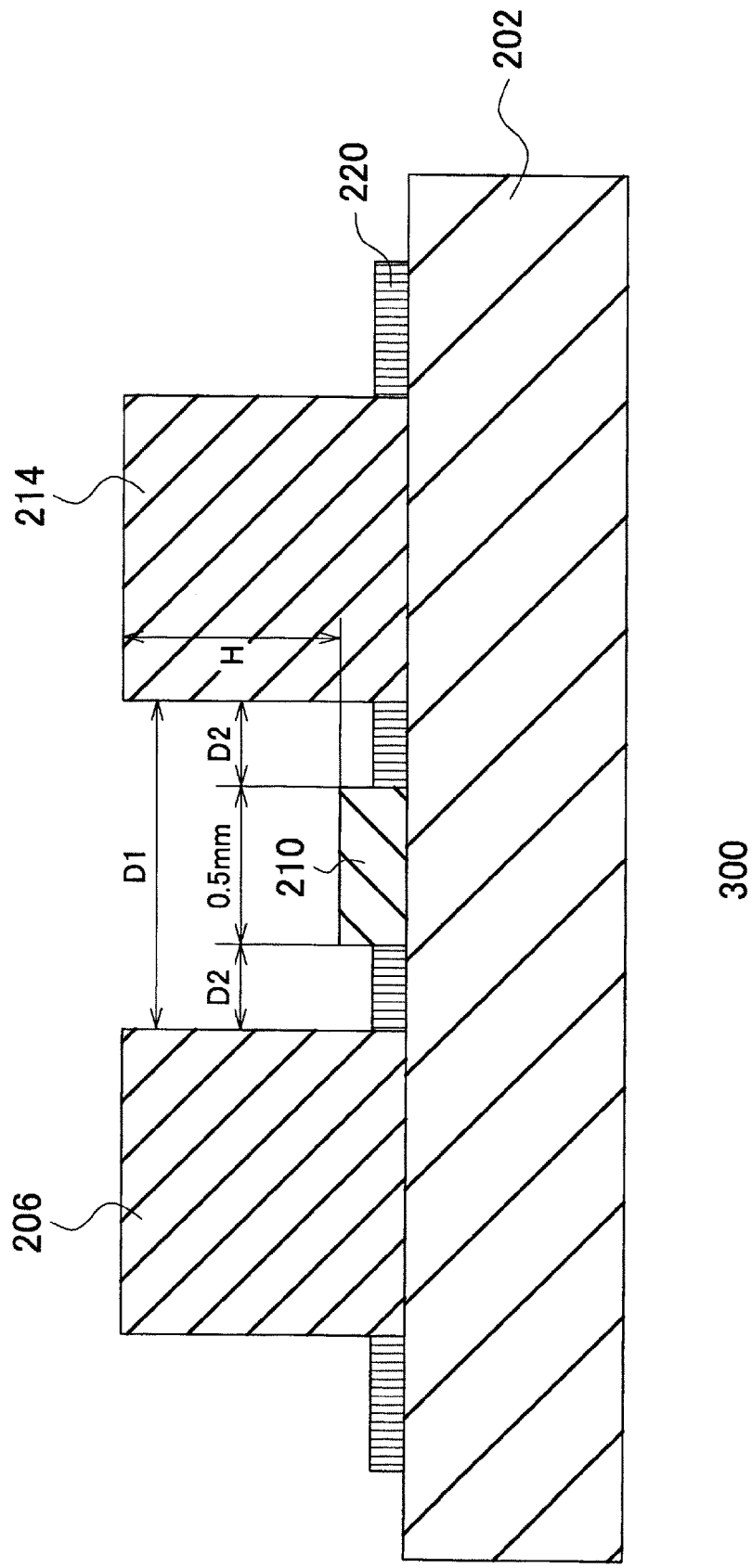
FIG. 9 shows an exemplary cross section of a package 300 according to Embodiment Example 1.

FIG. 9 shows an exemplary cross section of a package 300 according to Embodiment Example 1. The package 300 was created by mounting a substrate 202, and first, second, and third electronic components 206, 210, and 214. A heat resistant glass base epoxy resin laminate was prepared as the substrate 202. As each of the first electronic component 206 and the third electronic component 214, a dummy element made of the heat resistant glass base epoxy resin laminate and having a surface area of 3*2 mm$^2$ and a height of 1.35 mm was prepared. As the second electronic component 210, a 1005-size 0Ω jumper resistor having a height of 0.35 mm was prepared. The width of the second electronic component 210 is 0.5 mm. ACF was prepared as the anisotropic conductive film 220.

Here, the dilatancy fluid 116 is sand, and the base 118 is a sand-filled base. The sand-tilled base tilled with sand is used as a lower pressurizing section 102. The average particle diameter of sand in the sand-filled base is 0.25 mm. A metal head was used as an upper pressurizing section 104.

The relative positional relation among the heat resistant glass base epoxy resin laminate, the dummy elements, and the 0Ω jumper resistor is adjusted, and the heat resistant glass base epoxy resin laminate, the ACF, the dummy elements, and the 0Ω jumper resistor were arranged in the stated order. The heat resistant glass base epoxy resin laminate, the dummy elements, and the 0Ω jumper resistor were sandwiched between the sand-filled base and the metal head, and were subjected to thermocompression bonding for 20 seconds at a temperature of 180 degrees centigrade and at a pressure of 2 MPa, thereby completing the package 300. As Comparison Example 1, a package was created by using a ceramic base as a lower pressurizing section 102 and an elastic member as an upper pressurizing section 104, which were subjected to thermocompression bonding under the same condition as Embodiment Example 1.

The conduction contact resistance of the 0Ω jumper resistor was evaluated in cases where the height difference between the dummy elements and the 0Ω jumper resistor is adjusted to 1.0 mm and to 1.5 mm, respectively. The height difference H between the dummy elements and the 0Ω jumper resistor is shown by the arrow H in FIG. 9.

TABLE I

| HEIGHT DIFFERENCE (H) (mm) | INTERELEMENT SPACING (D1) (mm) | INTERELEMENT SPACING (D2) (mm) | EMBODIMENT EXAMPLE 1 | COMPARISON EXAMPLE 1 |
|---|---|---|---|---|
| 1.0 | 0.9 | 0.2 | ○ | x |
|  | 1.1 | 0.3 | ○ | x |
|  | 1.3 | 0.4 | ○ | ○ |
| 1.5 | 0.9 | 0.2 | ○ | x |
|  | 1.1 | 0.3 | ○ | x |
|  | 1.3 | 0.4 | ○ | x |
|  | 1.5 | 0.5 | ○ | ○ |

Table 1 shows the result of evaluating the conduction contact resistance for the package 300 of Embodiment Example 1 and the package of Comparison Example 1. ○ in Table 1 indicates that the conduction contact resistance is evaluated as 0.2Ω or be low so that conduction is possible, and × indicates that the conduction contact resistance is evaluated to exceed 0.2Ω so that conduction is impossible.

When the height difference H between the dummy elements (i.e. first and third electronic components 206 and 214) and the 0Ω jumper resistor (i.e. second electronic component 210) is adjusted to be 1.0 mm, the conduction is not possible in Comparison Example 1 unless the spacing D1 between the dummy elements is 1.3 mm or greater, which corresponds to the spacing of 0.4 mm between the dummy elements and the 0Ω jumper resistor. In contrast, in Embodiment Example 1, the conduction was still possible even when the spacing D1 between the dummy elements was narrowed down to 0.9 mm, which corresponds to the spacing of 0.2 mm between the dummy elements and the 0Ω jumper resistor. In Comparison Example 1, when the height difference H between the dummy elements and the 0Ω jumper resistor is 1.5 mm, the conduction is not possible unless the spacing D1 between the dummy elements is 1.5 mm or greater, which corresponds to the spacing of 0.5 mm between the dummy elements and the 0Ω jumper resistor. In contrast, in Embodiment Example 1, the conduction was still allowed even when the spacing D1 between the dummy elements was narrowed down to 0.9 mm, which corresponds to the spacing of 0.2 mm between the dummy elements and the 0Ω jumper resistor. The evaluation results in Table 1 show that the technique of the present embodiment enables to prevent failure in mounting the components to a package.

Embodiment Example 2

As a substrate 202, prepared is a TEG (test element group) substrate having lamination of heat resistant glass base epoxy resins and being provided with conductive sections at 200 μm pitch. A resistor of 1005-size is bonded to the lower surface of the substrate 202. A flexible print circuit provided with conductive sections at 200 μm pitch is prepared as a flexible print circuit 404.

Toluene was added to a 30 mass portion of Phenoxy resin (PKHH, manufactured by Union Carbide Corporation), a 10 mass portion of liquid epoxy resin (EP828, manufactured by Japan Epoxy Resins Co., Ltd.), a 1 mass portion of silane coupling agent (A-187, manufactured by Momentive Performance Materials Inc.), a 10 mass portion of rubber component (SG80H, manufactured by Nagase Chemtech Corp.), a 9 mass portion of conductive particles (Ni—Au plating φ5 μm, manufactured by Sony Chemical & Information Device Corporation), and a 40 mass portion of a hardening agent (HX3941HP, manufactured by Asahi Kasei Chemicals Corporation). The result was then adjusted to a resin solution having 50% solid content, and was applied to release PET film (manufactured by Sony Chemical & Information Device Corporation) using a bar coater. Then the solvent was dried in an oven at a temperature of 80 degrees centigrade, thereby preparing an anisotropic conductive film 220 having a thickness of 20 m.

Sand was used as a dilatancy fluid 116, and a sand-filled base was used as a base 118. The sand-filled base filled with sand was used as a low pressures section 102. The average particle diameter of sand in the sand-filled base was 0.25 mm. A metal head was used as an upper pressurizing section 104.

The relative positional relation among the TEG substrate and the flexible print circuit was adjusted, and the TEG substrate, the anisotropic conductive film 220, and the flexible print circuit were arranged in the stated order. The TEG substrate and the flexible print circuit were sandwiched between the sand-filled base and the metal head, and were subjected to thermocompression bonding for 10 seconds at a temperature of 190 degrees centigrade and at a pressure of 3 MPa, thereby completing the package 500. As Comparison Example 2, a package was created by using a rubber base as a lower pressurizing section 102, and a metal head as an upper pressurizing section 104, which were subjected to thermocompression bonding under the same condition as Embodiment Example 2. As Comparison Example 3, a package was created by using an excavated base as a lower pressurizing section 102, and a metal head as an upper pressurizing section 104, which were subjected to thermocompression bonding under the same condition as Embodiment Example 2, where the excavated base has convex and concave in accordance with the form of a 1005R-size resistor bonded to the lower surface of the substrate 202. As Comparison Example 4, a package was created by thermocompression bonding a flexible print circuit to a TEG substrate having no electronic component bonded to the lower surface thereof.

Under the high-temperature and high-humidity condition (i.e. temperature of 85 degrees centigrade and 85% RH humidity), 1000 hr aging test was conducted, to evaluate the conduction resistance between the substrate and the flexible print circuit of the package, for Embodiment Example 2, Comparison Example 2, Comparison Example 3, and Comparison example 4. The evaluation of the conduction resistance was performed using a four probe method.

Figure 10:
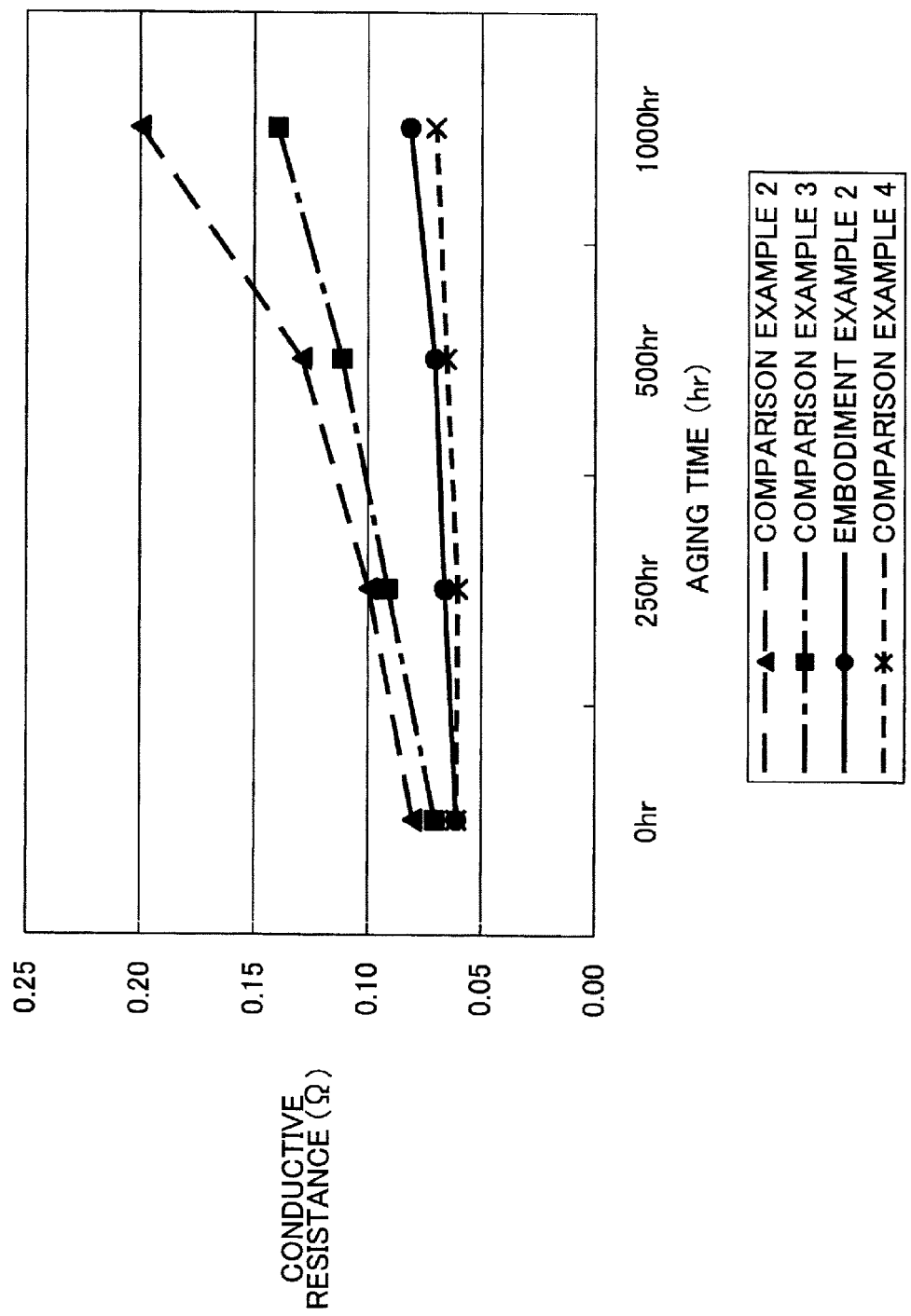
FIG. 10 shows an evaluation result of Embodiment Example 2.

FIG. 10 shows the evaluation result for Embodiment Example 2, Comparison Example 2, Comparison Example 3, and Comparison Example 4. For Comparison Example 2 and Comparison Example 3, in the lapse of aging time, the conduction resistance increased. In other words, the electric connection was instable in the package according to Comparison Example 2 and Comparison Example 3. On the other hand, Embodiment Example 2 was able to restrain conduction resistance increase in the lapse of aging time, just as Comparison Example 4. The evaluation result of Embodiment Example 2 indicates that the technique of the present embodiment enables to stabilize electric connection of a package.

The mounting device 100 and the mounting device 600 used in the above-described embodiments are of so-called face-down type. However, the mounting device 100 and the mounting device 600 are not limited to the face-down type, and can adopt a face-up type where pressurizing is conducted in a state where a plurality of electronic apparatuses are provided on an upper side of a substrate 202. The present invention can also adopt such a type of mounting device that pressurizes a substrate in a vertically upright state between a lower pressurizing section 102 and an upper pressurizing section 104 facing each other in the horizontal direction.

Although some aspects of the present invention have been described by way of exemplary embodiments, it should be understood that those skilled in the art might make many changes and substitutions without departing from the spirit and the scope of the present invention which is defined only by the appended claims.

The operations, the processes, the steps, or the like in the apparatus, the system, the program, and the method described in the claims, the specification, and the drawings are not necessarily performed in the described order. The operations, the processes, the steps, or the like can be performed in an arbitrary order, unless the output of the former-described processing is used in the later processing. Even when expressions such as "First," or "Next," or the like are used to explain the operational flow in the claims, the specification, or the drawings, they are intended to facilitate the understanding of the invention, and are never intended to show that the described order is mandatory.

What is claimed is:

1. A mounting method, comprising:
    preparing a first mounting target and a second mounting target;
    adjusting a relative positional relation between the first mounting target and the second mounting target; and
    sandwiching and pressurizing, via a cover sheet, the first mounting target and the second mounting target between a first pressurizing section and a second pressurizing section, thereby mounting the first mounting target and the second mounting target to each other; and
    carrying the cover sheet, wherein
    the first pressurizing section and the second pressurizing section are substantially flat,
    the first pressurizing section includes a dilatancy fluid,
    the second pressurizing section is provided above the first pressurizing section,
    the cover sheet covers an upper surface of the dilatancy fluid, and
    carrying the cover sheet includes a leveling section provided to an end of the first pressurizing section restraining the dilatancy fluid from being carried away with the cover sheet.

2. The mounting method according to claim 1, wherein
    the first pressurizing section or the second pressurizing section includes a heating section for heating the first mounting target or the second mounting target, and
    sandwiching and pressurizing, via the cover sheet, the first mounting target and the second mounting target between the first pressurizing section and the second pressurizing section includes sandwiching, via the cover sheet, the first mounting target and the second mounting target between the first pressurizing section and the second pressurizing section and pressurizing and heating the first mounting target and the second mounting target.

3. The mounting method according to claim 1, after adjusting the relative positional relation, further comprising:
    arranging the first mounting target, an anisotropic conductive film, and the second mounting target, in the stated order.

4. A mounting method, comprising:
    preparing a first mounting target and a second mounting target;
    adjusting a relative positional relation between the first mounting target and the second mounting target; and
    sandwiching and pressurizing, via a cover sheet, the first mounting target and the second mounting target between a first pressurizing section and a second pressurizing section, thereby electrically connecting a conductive section of the first mounting target to a conductive section of the second mounting target; and
    carrying the cover sheet, wherein
    the first pressurizing section and the second pressurizing section are substantially flat,
    the first pressurizing section includes a dilatancy fluid,
    the second pressurizing section is provided above the first pressurizing section,
    the cover sheet covers an upper surface of the dilatancy fluid, and
    carrying the cover sheet includes a leveling section provided to an end of the first pressurizing section restraining the dilatancy fluid from being carried away with the cover sheet.

5. The mounting method according to claim 4, wherein
    the first pressurizing section or the second pressurizing section includes a heating section for heating the first mounting target or the second mounting target, and
    sandwiching and pressurizing, via the cover sheet, the first mounting target and the second mounting target between the first pressurizing section and the second pressurizing section includes sandwiching, via the cover sheet, the first mounting target and the second mounting target between the first pressurizing section and the second pressurizing section and pressurizing and heating the first mounting target and the second mounting target.

6. The mounting method according to claim 4, after adjusting the relative positional relation, further comprising:
    arranging the first mounting target, an anisotropic conductive film, and the second mounting target, in the stated order.

* * * * *